US010408391B2

(12) United States Patent
Torvinen

(10) Patent No.: US 10,408,391 B2
(45) Date of Patent: Sep. 10, 2019

(54) ILLUMINATED STRUCTURE AND RELATED METHOD OF MANUFACTURE

(71) Applicant: TactoTek Oy, Oulunsalo (FI)

(72) Inventor: Sami Torvinen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 15/824,152

(22) Filed: Nov. 28, 2017

(65) Prior Publication Data

US 2018/0149321 A1  May 31, 2018

Related U.S. Application Data

(60) Provisional application No. 62/427,897, filed on Nov. 30, 2016.

(51) Int. Cl.
*F21S 4/00* (2016.01)
*F21K 9/61* (2016.01)
*F21V 8/00* (2006.01)
*H05K 1/02* (2006.01)
*H05K 1/18* (2006.01)
*H01L 25/075* (2006.01)
(Continued)

(52) U.S. Cl.
CPC .............. *F21K 9/61* (2016.08); *G02B 6/0001* (2013.01); *H01L 25/0753* (2013.01); *H05K 1/0284* (2013.01); *H05K 1/0296* (2013.01); *H05K 1/181* (2013.01); *F21Y 2103/10* (2016.08); *F21Y 2103/37* (2016.08); *F21Y 2115/10* (2016.08); *H01L 33/60* (2013.01); *H01L 33/62* (2013.01); *H05K 1/0274* (2013.01); *H05K 3/0014* (2013.01); *H05K 3/1216* (2013.01); *H05K 2201/09018* (2013.01); *H05K 2201/09036* (2013.01); *H05K 2201/09118* (2013.01); *H05K 2201/10106* (2013.01); *H05K 2203/1105* (2013.01)

(58) Field of Classification Search
USPC ........................................................ 362/223
See application file for complete search history.

(56) References Cited

U.S. PATENT DOCUMENTS 6,443,584 B2 *  9/2002  Suzuki ................. G02B 6/0028
                                                       362/223
2005/0007791 A1   1/2005  Helbach et al.
(Continued)

FOREIGN PATENT DOCUMENTS

DE    102014104423 A1   10/2015
EP        1357331 A2    10/2003
(Continued)

OTHER PUBLICATIONS

International Search Report issued by the Finnish Patent and Registration Office acting as the International Searching Authority in relation to International Application No. PCT/FI2017/050837 dated Jun. 15, 2018 (8 pages).
(Continued)

*Primary Examiner* — Jamara A Franklin
(74) *Attorney, Agent, or Firm* — Robert P. Michal, Esq.; Carter, DeLuca & Farrell LLP

(57) ABSTRACT

Embodiments of light-emitting multilayer structures incorporating substrate films 3D-formed with recesses for light sources and plastics material molded thereupon are presented. Related methods of manufacture are set forth as well.

28 Claims, 4 Drawing Sheets

(51) Int. Cl.
| | |
|---|---|
| F21Y 103/37 | (2016.01) |
| F21Y 103/10 | (2016.01) |
| F21Y 115/10 | (2016.01) |
| H05K 3/00 | (2006.01) |
| H05K 3/12 | (2006.01) |
| H01L 33/60 | (2010.01) |
| H01L 33/62 | (2010.01) |

(56) References Cited

U.S. PATENT DOCUMENTS

| | | |
|---|---|---|
| 2006/0097245 A1 | 5/2006 | Aanegola et al. |
| 2007/0177380 A1 | 8/2007 | Schultz et al. |
| 2008/0123367 A1 | 5/2008 | Pan et al. |
| 2009/0059609 A1 | 3/2009 | Marshall et al. |
| 2009/0154156 A1 | 6/2009 | Lo et al. |
| 2009/0174300 A1 | 7/2009 | Jousse et al. |
| 2013/0113397 A1 | 5/2013 | Salter et al. |
| 2014/0367633 A1 | 12/2014 | Bibl et al. |
| 2015/0092429 A1 | 4/2015 | Speer et al. |
| 2016/0279437 A1 | 9/2016 | Park |
| 2016/0295702 A1 | 10/2016 | Heikkinen et al. |

FOREIGN PATENT DOCUMENTS

| | | |
|---|---|---|
| EP | 1564819 A1 | 8/2005 |
| EP | 2337072 A2 | 6/2011 |
| EP | 2528122 A1 | 11/2012 |
| JP | 2007005091 A | 1/2007 |
| JP | 2011155060 A | 8/2011 |
| KR | 20150061522 A | 6/2015 |
| WO | 2006137647 A1 | 12/2006 |
| WO | WO-2013058708 A1 | 4/2013 |
| WO | WO-2015072120 A1 | 5/2015 |

OTHER PUBLICATIONS

Written Opinion of the International Searching Authority issued by the Finnish Patent and Registration Office acting as the International Searching Authority in relation to International Application No. PCT/FI2017/050837 dated Jun. 15, 2018 (18 pages).

Communication from PCT Invitation to Pay Additional Fees and, Where Applicable, Protest Fee and Communication Relating to the Results of the Partial International Search issued by the Finnish Patent and Registration Office acting as the International Searching Authority in relation to International Application No. PCT/FI2017/050837 dated Mar. 28, 2018 (9 pages).

Second Written Opinion of the International Searching Authority issued by the Finnish Patent and Registration Office acting as the International Preliminary Examining Authority in relation to International Application No. PCT/FI2017/050837 dated Feb. 22, 2019 (15 pages).

* cited by examiner

ILLUMINATED STRUCTURE AND RELATED METHOD OF MANUFACTURE

CROSS-REFERENCE TO RELATED APPLICATIONS

This Application claims priority to U.S. Provisional Application No. 62/427,897, filed Nov. 30, 2016 the entire disclosure of which is incorporated herein by reference.

FIELD OF THE INVENTION

Generally the present invention relates to electronics, lighting, associated devices, structures and methods of manufacture. In particular, however not exclusively, the present invention concerns a multilayer assembly with illuminated portions perceivable in the environment.

BACKGROUND

Generally there exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, automotive industry, car/vehicle exteriors (e.g. door handles, trims, bumpers, mirrors, etc.), vehicle such as car interiors, antennae, labels, (in-) vehicle electronics, control panels, dashboards, trims, seats, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not necessarily always the case.

When a multilayer structure is loaded with various electronics, related power, data and/or control connections may have to be provided thereto, which typically requires provision of electrical connectors and related wiring even though also wireless connections may be occasionally applicable. Further, mechanical fixing of multilayer solutions to host surfaces may occasionally be troublesome.

In applications, where a number of elements such as electronic components and related layers are to be integrated together in a three-dimensional (3D) structure, the required additional 3D type assembly of electronics may turn out time-consuming and technically difficult.

Yet, in connection with multiple radiation-emitting such as light-emitting components included in the same structure, various problems arising from mutual disturbances between them may easily arise. For instance, so-called light leakage or crosstalk phenomena are common issues with solutions involving a greater number of light sources in the same assembly, among other potential challenges. Generally, one could say that controllability of light remains a challenge. Desired and actually achieved optical paths of light propagating within a structure, and related target and realized distributions, may in practical circumstances differ considerably from each other. For example, light emitted from a light source may initially be too collimated or spread, whereupon the related light transmitting or directing structure should contain features for correcting the situation. Many contemporary light control features further tend to increase local material thickness of a concerned structure even quite considerably, which may be problematic in scenarios where the local thickness should remain moderate.

SUMMARY

The objective of the present invention is to at least alleviate one or more of the above drawbacks associated with the existing solutions in the context of integral multilayer structures and electronics embedded therein.

The objective is achieved with various embodiments of a multilayer structure and related method of manufacture in accordance with the present invention.

According to one embodiment of the present invention, a light-emitting multilayer structure for electronic device, comprises:

a substantially opaque cover member with a number of elongated indicator elements extending through the cover member, the cover member having an outer face towards the environment and substantially opposite inner face towards the internals of the structure, each elongated indicator element having a periphery that defines a corresponding indicator shape, optionally substantially a stripe, in the cover member, said indicator element comprising at least optically translucent, optionally transparent, material to transmit light incident thereon and enable backlight arriving at the inner face to exit via the outer face, a flexible substrate film layer of at least one film, 3D-shaped, preferably thermoformed, to define a number of elongated recesses substantially aligned with the number of indicator elements of the cover member, the film layer hosting, in each of the formed recesses, a plurality of substantially aligned light sources disposed thereon, preferably LEDs or other electric light sources, spread along the length of the recess and configured to emit light, optionally via integral or separate optics, substantially towards the cover member, and a thermoplastic optically transmissive light-guiding material layer molded onto the film layer between the film layer and the cover layer so as to embed said plurality of light sources while defining a plurality of elongated protrusions aligned with the recesses and the indicator elements, each of the protrusions being configured to convey the light emitted by the underlying light sources of the corresponding recess of film layer towards the cover member, while preferably supporting substantially total internal reflection based propagation of light therewithin enabled by an interface between the side walls of the protrusions and the neighbouring material, preferably air or other gaseous material.

In various embodiments, the light-guiding transmissive layer that has been molded upon the substrate film layer may generally follow the 3D-shapes of the film layer, i.e. it may add basically either constant or varying thickness thereto, while it preferably also contains more deviating forms such as at least the protrusions extending towards the cover member and thus the target environment of the structure having regard to lighting purposes. The layer contains material that preferably enables total internal reflection (TIR) type propagation of light therewithin provided that the light incident on the interface between the protrusion (side walls) and neighbouring material, typically air or other gaseous material, has sufficient angle of incidence (greater than the critical angle) and that the refractive index of the protrusion is greater than that of the environment, which is usually the case when the material of the molded layer is plastics and the interfacing other matter is e.g. air.

Preferably, there is a plurality of light sources aligned in a row in each aforesaid recess. In some embodiments, the alignment may be different or contain further formations in addition to the row formation, however. The light sources in a recess may be associated with a dedicated overlapping protrusion of said plurality of protrusions established by the molded material. The dedicated association refers mainly to optical connection in this case, i.e. the light emitted by the light sources is transmitted by the associated above protrusion, which is aligned above the recess in manner that it mostly, if not solely, receives light from the underlying light sources of the particular recess only.

An embodiment of a method for manufacturing the structure comprises:

obtaining a flexible substrate film layer of at least one film, providing, preferably through utilizing printed electronics technology such as screen printing, a number of electrically conductive traces to the substrate layer to establish a predetermined circuit design, configuring a plurality of light sources on the substrate layer, preferably LEDs or other electric light sources, as substantially aligned in a plurality of rows, connected to the circuit design established by the traces, 3D-shaping, preferably through thermoforming, the substrate layer so as to define, for each said row of light sources, an elongated recess at the bottom of which the corresponding row is located, molding a thermoplastic optically transmissive light-guiding layer onto the film layer to embed said plurality of light sources in said plurality of rows located in the elongated recesses and preferably at least part of the circuit design defined by the traces, wherein said light-guiding layer further defines upon each recess and related row of light sources in the recess, a light-guiding, optically transmissive protrusion extending away from the substrate layer and said related row of light sources, and providing, preferably through lamination, a substantially opaque cover member with a plurality of elongated indicator elements extending through the cover member upon the molded light-guiding layer, the cover member having an outer face towards the environment and substantially opposite inner face towards the internals of the structure including the molded light-guiding layer with the protrusions and underlying film layer with the plurality of light sources, wherein said plurality of indicator elements, rows of light sources and protrusions are mutually aligned so as to enable light propagation from each light source, via the overlapping light-guiding layer and a protrusion thereof, into a still overlapping indicator element of the plurality and the environment therethrough.

In preferred embodiments, each of the aforesaid rows of light sources is preferably associated with a dedicated, aligned overlapping protrusion of said plurality of protrusions and a dedicated, aligned overlapping indicator element of said plurality of indicator elements for establishing the optical path between the row and the environment.

In a further embodiment, a stacked, preferably integral, light-emitting multilayer structure for electronic device, comprises:

a flexible substrate film layer of at least one film, 3D-shaped, preferably thermoformed, to define a number of, preferably a plurality of, aligned recesses on a first side thereof, the film layer hosting, on the first side in each formed recess, at least one light source disposed thereon, preferably LEDs, configured to emit light through the film layer to a second, opposite side thereof and thereby preferably towards the environment, wherein for the purpose the film layer contains, in each said recess, at least a portion in contact with the transmissive, optionally integral and/or separate, optics of the light source and extending through the film layer, said at least portion being optically at least translucent, preferably substantially transparent, and a thermoplastic, optionally substantially opaque, layer molded onto the first side of the film layer, said molded layer preferably substantially embedding the light sources hosted by the film layer.

An embodiment of a related method of manufacture comprises:

obtaining a flexible substrate film layer of at least one film, wherein the film layer is at least in places optically translucent or substantially transparent, preferably providing, optionally through utilizing printed electronics technology such as screen printing, a number of electrically conductive traces to the substrate layer to establish a predetermined circuit design, configuring a number of, preferably a plurality of, light sources on a first side of the substrate layer, preferably LEDs, as optionally substantially aligned in at least one row (in the case of multiple sources) and preferably connected to the circuit design established by the traces, wherein the optics, optionally integral and/or separate, of each light source is further aligned so as to contact the film layer at a position where the film layer is optically at least translucent, preferably substantially transparent, 3D-shaping, preferably through thermoforming, the substrate layer so as to define, for each light source of said number, optionally dedicated recess at the bottom of which the corresponding light source is located, and molding a thermoplastic, optionally opaque, layer onto the first side of the film layer to preferably embed said number of light sources located in the recesses and preferably at least part of the circuit design defined by the traces.

In a further embodiment, a stacked, preferably integral, light-emitting multilayer structure comprises:

a flexible first substrate film layer of at least one film, 3D-shaped, preferably thermoformed, to define a number of, optionally a plurality of, recesses on a first side thereof, said recesses optionally having obtuse edges, wherein the film layer is optically opaque or transmissive, optionally translucent or transparent, a cover comprising one or more material layers, having an outer face towards the environment and substantially opposite inner face towards the internals of the structure including the number of recesses, said cover comprising at least a portion of optically transmissive, preferably at least in places diffusive, material extending through the layer and optionally further comprising substantially opaque material, said cover layer optionally defining an indicator element and/or a graphical shape such as a logo, symbol or icon to be illuminated via the inner face, the film layer hosting, in each of the recesses, at least one light source disposed thereon, preferably LED, configured to emit light to propagate within the structure towards the inner face of the cover and therethrough towards the environment, and an intermediate thermoplastic, optically transmissive, optionally translucent or substantially transparent, layer molded onto the film layer, said molded layer substantially embedding the light sources of the number of recesses.

In a further related embodiment, a method for manufacturing a light-emitting multilayer structure comprises:

obtaining a flexible substrate film layer of at least one film, preferably providing, optionally through utilizing printed electronics technology such as screen printing, a number of electrically conductive traces to the substrate layer to establish a predetermined circuit design, configuring a number of, optionally a plurality of, light sources on a first side of the substrate layer, such as LEDs, preferably connected to the circuit design established by the traces, 3D-shaping, preferably through thermoforming, the substrate layer so as to define, for each light source of said number, optionally a dedicated recess at the bottom of which the corresponding light source is located, molding a thermoplastic, optically transmissive such as translucent or substantially transparent, material layer onto the first side of the film layer to preferably embed said number of light sources located in the recesses and further preferably at least part of the circuit design defined by the traces, and laminating a cover comprising one or more material layers upon the molded layer and optional optically transmissive second film thereon, said cover having an outer face towards the environment and substantially opposite inner face towards the internals of the structure including the recesses, said cover comprising at least a portion of optically transmissive, preferably at least in places diffusive, material extending through the layer and optically coupling the environment to the light sources, and optionally further comprising substantially opaque material, said cover layer optionally defining an indicator element and/or a graphical shape such as a logo, symbol or icon to be illuminated via the inner face by said number of light sources.

In various embodiments of the above structures and methods, the indicator elements, (thermo)plastic molded layer and/or the substrate film layer may thus comprise optically substantially opaque, translucent or transparent material, at least in places, enabling e.g. visible light to pass through it with negligible loss. The sufficient optical transmittance at desired wavelengths may in the latter cases be at least about 70%, 75%, 80%, 85%, 90%, 95% or even higher, for example. The considered target wavelengths may indeed vary embodiment-specifically and having regard to some embodiments/elements, transmittance of substantially all visible wavelengths of light may be relevant whereas in some other embodiments, the interest may be in more specific or broader bandwidth(s).

Still, in various embodiments, the multilayer structure may be provided with additional features such as electronics, fixing features, layers or specifically, films, which may have optical or some other function. Examples of such features are discussed in more detail hereinafter.

Generally, the feasible molding methods include e.g. injection molding. In case of several plastic materials included, they may be molded using a two-shot or generally multi-shot molding method. A molding machine with multiple molding units may be utilized. Alternatively, multiple machines or a single re-configurable machine could be used for sequentially providing several materials.

The previously presented considerations concerning the various embodiments of the structure may be flexibly applied to the embodiments of the method mutatis mutandis, and vice versa, as being appreciated by a skilled person.

The utility of the present invention arises from a plurality of issues depending on the embodiment.

Rows or other formations of light-emitting components such as LEDs may be cleverly positioned at the bottom of recesses established through forming the originally planar substrate film layer. In some embodiments, a dedicated recess may be allocated to a single light source such as LED. Alternatively, the recess of e.g. elongated shape may include a plurality of light source elements such as LEDs. As each light source or a line/row or generally formation of light sources may be allocated a dedicated recess, the leakage or crosstalk between the light sources positioned in different recesses may be reduced. Accordingly, various lighting effects created utilizing the light sources remain visually sharp and clear as originally intended without various pollution problems caused by stray light perceived outside the structure via e.g. unintended elements thereof, such as an unintended indicator element of the cover member. Correspondingly, the optical efficiency of the solution is increased and the illumination of the indicator elements or other elements through which the emitted light propagates to the environment may be rendered to appear substantially uniform without substantial hot spots.

The recesses accommodating light sources and e.g. material molded thereupon may be configured, by proper material selections, dimensioning and shaping, for instance, to establish optically functional features for controlling light. For example, the recesses and associated walls or generally material interfaces may be configured to alter the characteristics such as distribution of light by diverging (spreading) or collimating it. In some embodiments, the molded material may be configured to establish a protrusion shape within the structure, e.g. extending along and upon an elongated recess shape. In some embodiments, the film(s) and/or material thereon, such as the molded material, may be shaped to establish an optical element, e.g. a lens shape. Accordingly, distance between the light sources and a target surface outcoupling the light to the environment may still remain relatively short, which is in many embodiments preferred as the material thickness is minimized accordingly, possibly aiding integration and miniaturization of the structure. In some embodiments, positioning of the light source(s) at the bottom of a recess may be utilized to bring the related substrate film and thus the light source(s) closer to the target surface located below the recess-containing substrate, which may again increase the optical efficiency and minimize negative effects such as light leakage.

The uniformity of the perceived outcoupled light may be further enhanced by including diffusive elements, such as layer(s) of embedded (surface) reliefs forms or diffusive white surfaces hosted by e.g. film(s) within the structure. By the proper use of reflective and/or absorptive elements, e.g. surfaces or layers imparting white and/or black color to light incident thereon, respectively, undesired light propagation and especially outcoupling may be minimized.

The lighting effect(s) obtained may be of informative and/or aesthetic (artistic) nature instead of or in addition to illumination of environment and/or the structure itself. The light(s) may be thus controlled to communicate information such as status indications to a viewer in the environment. The effects may be dynamic through dynamically controlling the light sources such as on/off, color and/or brightness state (emission intensity, dimming) thereof over time. Accordingly, the dynamic control may provide for various spatial effect(s) such as animations propagating in the structure e.g. within the indicator elements. These effects may include e.g. lighting stripes or other spatially either somewhat discrete or more continuous appearing effects depending e.g. on the spacing between adjacent light sources (which may be scaled based on application requirements). A number of conditions or parameters may be translated into control input for the embedded light sources by the utilized control logic. For example, time (e.g. time of day), speed (e.g. speed of a hosting vehicle or person), or a status/state of user-selectable feature (e.g. state of volume control of audio device) can be converted into control of the light sources. Accordingly, different visual indicators, mood or emotional lighting effects may be produced, for instance.

Yet, manufacturing of the structure is facilitated as the electronics such as light sources and potential various communication or control elements, such as connectors or control chips, respectively, may be assembled on the substrate when it is still substantially planar in contrast to awkward 3D assembling procedures where the assembly is performed having regard to essentially three-dimensional element on different layers thereof.

As the structure may be formed to substantially non-planar, e.g. curved, shape, it may easily find use in applications wherein the use of planar shape is not possible or at least desired either for aesthetical or functional reasons e.g. in terms of host device/slot dimensions.

Yet, the obtained structure may be easily mounted on a target surface. The structure may remain relatively light and flat with high degree of integration. It may even comprise integral support and/or attaching elements such as bosses for positioning and fixing purposes.

Generally, the obtained multilayer structure may be used to establish a desired device or module in host elements or devices such as an intelligent garments (e.g. shirt, jacket, or trousers, or e.g. a compression garment), other pieces of wearable electronics (e.g. wristop device, headwear, or footwear), vehicles, dashboard or other features of vehicle interior, personal communications devices (e.g. smartphone, phablet or tablet), entertainment electronics such as audio devices, displays/televisions or audio-video devices, domestic appliances, power tools, computers, and various lighting solutions. The structure may be thus included in various applications in the field of e.g. infotainment and decoration. Both consumer and professional applications are feasible. The integration level of the obtained structure may be high and desired dimensions such as the thickness thereof small.

The film(s) constituting a part of the obtained multilayer structure may contain graphics and other visually and/or tactilely detectable features thereon, whereupon the film may have aesthetic and/or informative effect in addition to hosting and protecting the electronics. The film(s) may be translucent or opaque at least in places. They may be of desired color or comprise portions of desired color. The obtained multilayer structure may thus incorporate one or more color/colored layers that optionally determine graphics such as text, pictures, symbols, logos, icons, patterns, etc. These layers may be implemented by dedicated films of certain color(s), for instance, or provided as coatings (e.g. through printing) on existing film(s), molded layer(s), and/or other surfaces. Generally IML/IMD (in-mold labeling/decorating) technique may be utilized for embedding graphics within the structure.

The included film(s) and/or molded plastics may be configured to establish at least a portion of outer and/or inner surface of the associated product.

The visual features such as graphical patterns or coloring may be provided via internal layers of the structure so that the features remain isolated and thus protected from the environmental effects at least by the thickness of the film. Accordingly, different impacts, rubbing, chemicals, etc. that could easily damage e.g. painted surface features do not normally reach them.

The molded thermoplastic material(s) may be optimized for various purposes including securing electronics, and specifically e.g. light sources, masking (blocking) at least some of the structure internals from external view, and/or conveying light (thus being transmissive material with optionally specifically light-guiding configuration such as dimensions and positioning). Yet, the material(s) may be configured to protect the electronics from e.g. environmental conditions such as moisture, heat, cold, dirt, shocks, etc. It may further have desired properties in view of light transmittance and/or elasticity, for example.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

The terms "film" and "foil" are herein used generally interchangeably, unless otherwise explicitly indicated.

The term "dedicated" may herein refer to a degree of exclusivity in terms of a concerned functionality and/or element in question, e.g. a dedicated recess may be allocated to a light source meaning that there are no further light sources inside the recess but there may still be further elements other than light sources inside the recess, unless otherwise specifically declared.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
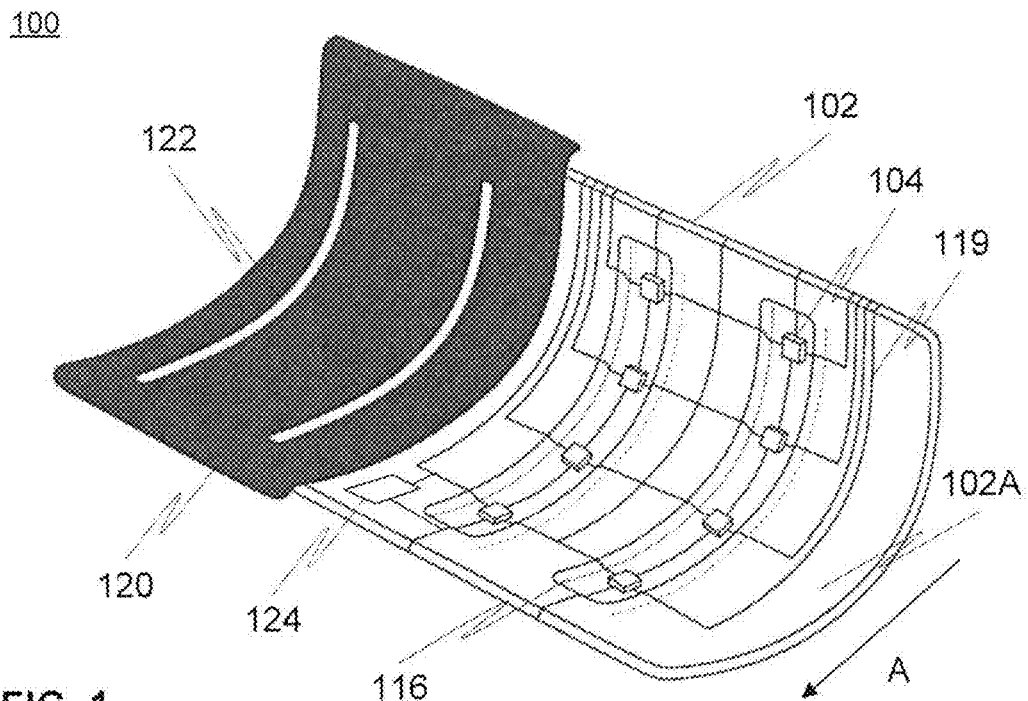
FIG. 1 illustrates one embodiment of a multilayer structure in accordance with the present invention with a molded layer and potential further layer(s) provided thereon removed from a cutaway portion also omitting a cover member for clarity and explanatory reasons.
Figure 2:
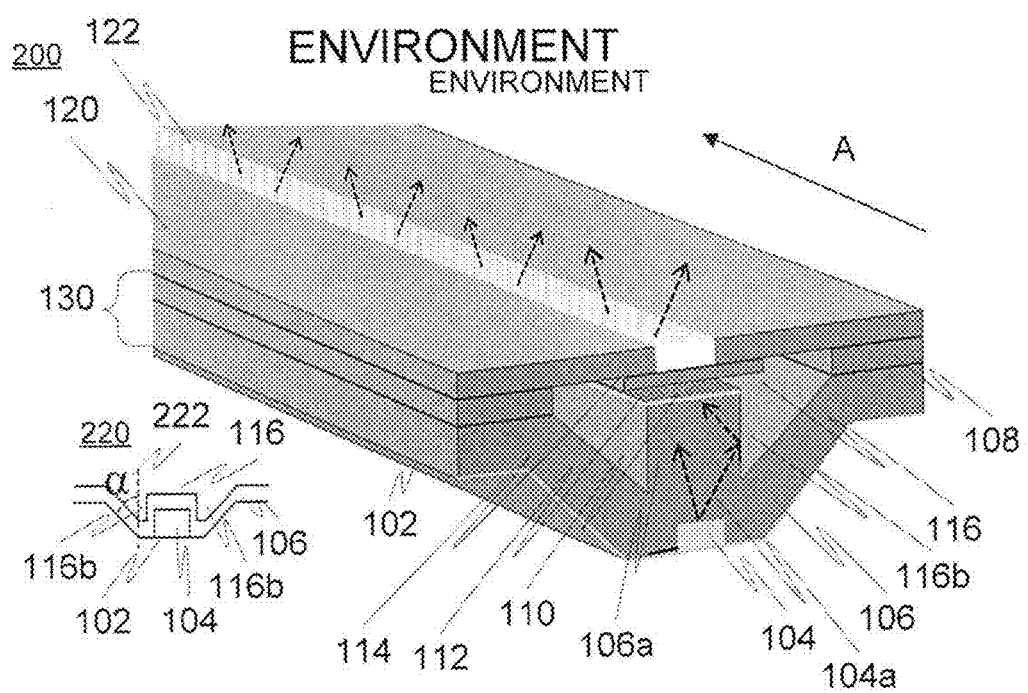
FIG. 2 is an axonometric cross-sectional view of the embodiment of FIG. 1.

FIG. 1 illustrates at 100, via a partial cutaway view, an embodiment of a multilayer structure. FIG. 2 shows at 200, an axonometric cross-sectional view of the embodiment of FIG. 1. The finished multilayer structure may, either as such or subsequent to further processing, effectively establish an end product of its own, e.g. an electronic device, or be disposed in a host device or element as a building block or component module thereof.

The shown embodiment 100 exhibits a generally substantially curved 3D-shape but also other shapes such as more angular or planar shape are fully feasible.

The substrate film layer 102 of one or more films and optionally further layer(s) may consist of or comprise, for instance, at least one material selected from the group consisting of: polymer, plastics, thermoplastic material, PMMA (Polymethyl methacrylate), Poly Carbonate (PC), polyimide, a copolymer of Methyl Methacrylate and Styrene (MS resin), glass, Polyethylene Terephthalate (PET), carbon fiber, and metal.

The layer 102 may be optically substantially opaque, translucent or transparent, or it may contain portions of different optical properties such as aforesaid transparency.

In addition to a number of films, the layer 102 may have been provided with coating on one or both sides with different coatings such as paint, ink or tape, which may be optically opaque, translucent, or transparent. In addition or alternatively, the layer 102 may contain a number of internal elements such a paint, ink, or tape layers. The coating and other layers may have e.g. optical function such as reflective, absorptive, and/or diffusive function.

The layer 102 is preferably flexible.

The layer 102 may be of equal or varying thickness. The thickness may be in the magnitude of about 0.1 millimeters, for example, having regard to a planar film or stack of several films laminated together. After 3D-forming, such as thermoforming, the resulting maximum thickness of the formed part may be considerably greater, e.g. several times greater, than the initial thickness of a substantially planar layer 102.

The layer 102 contains preferably additively printed, optionally screen-printed or ink jetted, electronics such as conductive areas in the form of e.g. conductor traces and optionally contact pads for electronic components, e.g. the ones shown at 119. In addition to or instead of printable conductive ink(s), e.g. solder, conductive adhesive and/or wiring could be employed in producing the desired electrically conductive elements and e.g. related circuit design.

The layer 102 may at least locally, in places, comprise a masking, preferably opaque or translucent, optionally dark-colored such as substantially black color imparting, layer on a base layer that accommodates e.g. the traces and optionally the light sources. The masking layer optionally comprising e.g. film, paint/ink, or tape, may be configured to block or at least hinder e.g. external view of the elements below, such as the traces 119 of the base.

Yet, a plurality of light sources 104 in the form of e.g. surface mounted devices (SMD) such as LEDs (chips), OLEDs (organic LEDs) or other optoelectronic components with integral and/or separate external optics (e.g. lens, reflector, TIR optics/lightguide, and/or other transmissive element) have been provided on the layer 102, preferably as aligned in a number of desired formations such as multiple parallel row/line formations, other elongated formations or formations of substantially other shape. Yet, e.g. the lines or other formations could be substantially straight or twisty.

The light sources 104 may be of top-emitting, or in some embodiments e.g. of side shooting, type as to deliberated in more detail hereinafter. The distance between the adjacent light sources 104 of the formation may be constant or varying. The same applies to the distance between adjacent formations such as lines.

Further electrical elements or electronic components, e.g. control electronics (e.g. controller, processor, memory chip, programmable logic, connector, antenna, etc.) and/or sensing electronics 124 may have been provided upon the film layer 102 by mounting and/or printing, for example. Such electronics 124 may have been connected to the light sources 104 via traces 119, for example, for control or other purposes.

The electronics 124 may include at least one element selected from the group consisting of: optoelectronic component, microcontroller, microprocessor, signal processor, DSP (digital signal processor), sensor, programmable logic chip, memory, transistor, resistor, capacitor, inductor, memory array, memory chip, data interface, sensing element, accelerometer, inertial sensor, light-sensitive component, photovoltaic cell, photodiode, photodetector, connector, transceiver, wireless transceiver, transmitter, receiver, wireless transmitter, and wireless receiver.

The electronics 124 may include a sub-assembly. For instance, one or more components may have been first provided on a separate substrate, e.g. a circuit board such as an FPC (flexible printed circuit) or a rigid, e.g. FR4 type (flame retardant), board, and subsequently attached as a whole (i.e. as a sub-assembly) to the target substrate 102. Optionally a flexible connector or generally contact element(s) may have been used to electrically connect the sub-assembly to the substrate 102 and e.g. traces 119 thereon.

Each light source 104 may emit certain wavelength(s), i.e. color(s), or be dynamically controllable having regard to the characteristics such as the wavelength and/or intensity of emitted light.

The layer 102 has been 3D-formed so as to define a number of, or more typically, a plurality of preferably elongated recesses 116. Each aforesaid formation of light sources may be provided with a dedicated recess at the bottom of which the formation is located. In some embodiments, the formation such as a line may extend substantially the length of the concerned recess 116. In some alternative implementations, even a single light source 102 could be provided with a dedicated recess 116. An example of such solution is provided hereinafter with reference to FIGS. 3A-3B.

At least one recess-defining portion of the layer 102 may be, at least in places, highly reflective, optionally diffusive and further optionally imparting white color to light incident thereon. This may add to the optical efficiency of the solution as the incident light originally emitted by a light source 104 may be then reflected to a desired direction, i.e. towards the cover member 120.

At least one portion of the layer 102 external to the recesses may be substantially opaque and optionally highly absorptive, further optionally imparting dark, such as black, color to light incident thereon. Such arrangement may reduce the crosstalk and leakage between the 'channels' or 'passages' established by the separate recesses 116 and light sources 104 therewithin.

At 200, a material layer 106, molded upon the film layer 102 and at least part of the electronics 104, 119, 124 (being thus embedded in the molded material), is shown.

The molded material of layer 106 may incorporate e.g. plastics such as elastomeric resin. In more detail, the layer 106 may include at least one thermoplastic material selected from the group consisting of: PC, PMMA, ABS, PET, nylon (PA, polyamide), polypropylene (PP), TPU (thermoplastic polyurethane), TPSiV (thermoplastic silicone vulcanizate), polystyrene (GPPS), and MS resin.

The layer 106 preferably defines a number of, or correspondingly, a plurality of protrusions 106a aligned with the recesses 116. For each recess 116, there may be one or more protrusions 106a formed 106a by the overmolded layer 106 so that the preferably elongated protrusion(s) 106a associated with a recess 116 overlaps with the recess 116, preferably substantially extending the length of the underlying recess 116. The length of a protrusion 116a associated with a recess 116 may thus optionally substantially match with the length of the recess 116. A protrusion 106a may be substantially perpendicular relative to the bottom of a corresponding recess 116.

The molded layer 106 may define, as being also shown at 220, a substantially w-shaped cross-section taken in the transverse direction relative to at least one recess 116, aligned light sources, and elongated protrusion 106a, the protrusion 106a thus defining a middle ridge of the w-shaped cross-section.

Generally, at least one elongated recess 116 of the 3D-shaped substrate film layer 102 may define a substantially trapezoidal, preferably isosceles or three-equal side, cross-sectional shape with a shorter base accommodating the light sources and a longer base omitted (being thus open). The recesses 116 may have at least some obtuse and optionally rounded edges. In some embodiments, one or more edges may be sharp(er) depending e.g. on the formability of the film layer. This is evident e.g. on the basis of the sketch at 220 if considering it having the molded layer 106 first removed therefrom. Accordingly, the sides of the trapezoidal shapes defining the legs thereof may establish about 45 deg angle, see alpha 222, relative to the film layer 102 and the surface normal of the film layer at the bottom of the recess 116.

Still, at least one elongated protrusion 106a and two side walls established by the molded layer 106 produced upon a recess 116 of the film layer 102 may define preferably mutually symmetric valleys 116b containing other material, such as air or other gaseous material, between each of said side walls and the elongated protrusion residing in between. The valleys 116b may thus form a part of the recess 116, or what remains from it after molding the layer 106 with protrusion 106a thereupon.

Preferably, the layer 106 is substantially optically transparent or at least translucent having regard to selected wavelengths, such as wavelengths visible to a human eye and emitted by the embedded light sources 104. Accordingly, the layer 106 is configured to transmit and preferably guide the light emitted the sources 104 towards the environment so that a user in the environment may perceive the light. The transmittance at desired wavelengths may be about 70%, 75%, 80%, 85%, 90%, 95% or even higher, for example.

Preferably the layer 106 is configured so as to enable substantially total internal reflection based propagation of light therewithin. Accordingly, the materials and incident angles of light emitted by the sources 104 at an interface between the side walls of each protrusion 106a and the neighbouring material, preferably air or other gaseous material as mentioned hereinbefore, have been selected so the total internal reflection based propagation is possible within the layer 106.

The preferably elongated shape of the protrusion 106a facilitates spreading the light propagating therewithin also in longitudinal direction of the recess 116 and naturally the protrusion 106a itself while the light generally proceeds towards the environment. Accordingly, the uniformity of the outcoupled light may be enhanced and hotspots reduced, for example.

In practice, the incident angles of light arriving at the interface from within the molded material 106 and especially from within the protrusion 106a portion thereof shall exceed a so-called critical angle of the interface as defined by the associated refractive indexes of the concerned interfacing materials in question, where the index of the layer 106 should particularly exceed the one of the neighbouring material(s) of the valleys 116b upon the recess 116.

Yet, the multilayer structure preferably includes a cover member 120 of one or more material layers. The cover member 120 may have an outer face pointing towards the environment and a substantially opposite inner face towards the internals of the structure as shown in FIG. 2.

Preferably, the cover member 120 comprises a plurality of optionally elongated indicator elements 122 extending through the cover member 120 in thickness direction so that the light emitted by the underlying light sources 104, after been propagated within the light-guiding molded layer 106 and becoming incident on an aligned indicator element 122, may pass through either in a specular or e.g. scattering fashion, as indicated in the figure by the broken arrows conceptually depicting the related optical paths. One or more dimensions such as the length of an indicator element 122 may optionally substantially match with the length of an associated underlying protrusion 116a and/or related recess 116.

The indicator element 122 thus preferably comprises at least optically translucent, optionally transparent, and typically solid material to transmit light incident thereon and enable backlight arriving at the inner face to exit via the outer face. To establish an effective, shortish optical path between a number of light sources 104 in a recess 116 and an indicator element 122, the recess 116 and the line or other formation of light sources 104 therein, the intermediate molded protrusion 106a, and the indicator element 122 of the cover 120 may have been stacked so as to at least partially, optionally fully, overlap with each other. In some embodiments, the indicator element 122 could be defined by a through-hole in the cover member 120.

Nevertheless, the indicator element 122 has a periphery that defines a corresponding indicator shape, optionally substantially a straight or twisty stripe/line, in the cover member 120. The element 122 may have been introduced in the cover member 120 as a separate material element thus defining a window covered in translucent or transparent material in the member 120, or it may have been originally integral and homogenous therewith but tailored afterwards by different (e.g. omitted) ink, paint or material layer, or further processing, which has rendered or left the surrounding cover material opaque. The material of the cover member 120 may generally include plastics, glass, rubber or rubberous material, leather, textile/fabric material, carbon fabric, wood, metal, etc.

The cover member 120 is, excluding the areas or volumes of indicator elements 122, preferably optically substantially opaque relative to selected wavelengths such as ones emitted by the light sources 104 and/or external ambient light sources such as the sun. It 120 may impart a selected color, feasible colors ranging from bright colors to black, to light incident thereon. It 120 may be reflective or absorptive (e.g. substantially black). The material of the indicator element 122 may be similar or considerably different. It may comprise plastics or glass, for instance. The sufficient transmittance of the element 122 may be at desired, e.g. visible, wavelengths about 70%, 75%, 80%, 85%, 90%, 95% or even higher, for example. The cover member 120 may have been laminated to the underlying layers by adhesive, heat, and/or pressure, for instance. Alternatively, it 120 may have been removably attached thereto utilizing e.g. screws, nails, rivets or other connecting elements.

There may be a number of further layers, e.g. films or other material layers, between the cover member 120 and the molded layer 106.

Indeed, one or more adhesive layers 108 may be provided between the cover member 120 and underlying layer(s) such as the molded layer 106, or a further layer thereon facing the member 120. The adhesive 108 may have been configured to secure the cover member 120 to the underlying layer. The adhesive 108 may be optically opaque, translucent or substantially transparent. Opaque adhesive 108 may be applied, at least in places, in further reducing the crosstalk/leakage between the neighbouring optical channels, i.e. neighbouring recesses 116 and e.g. related lines or other formations of light sources 104.

The potential further films or other layers provided between the molded light-guiding layer 106 and the cover member 120 optionally contain at least one element selected from the group consisting of: optical surface relief form, optical surface relief form structure, optical grating structure, diffusing structure, diffuser film or other layer, printing, printed letter, printer number, printed shape, printed image, and printed graphics.

In-mold film, laminated film or other layer 110 may have been provided with optical shapes (e.g. diffusing or collimating) and/or printing as discussed hereinabove.

A gap 112, potentially filled with air or other gaseous material, may have been provided between at least one of said protrusions and the cover member.

A further film or generally layer 114 may have been provided, incorporating e.g. diffusing optics and/or printing, in the optical path, preferably on the opposite side of the gap 112 and closer if not immediately adjacent to the cover member 120 and e.g. indicator element 122 thereof.

In some embodiments, a number of further layers such as a molded layer may have been provided also on the opposite side 102B of the film layer 102 (not shown). These layers may have isolating, protective, decorative, optical and/or attaching function, for example. IML (in-mold labeling)/IMD (in-mold decoration) technique may have been applied to provide embedded graphics, colors, etc. within the structure 100, optionally specifically to the cover member 120, substrate film 102, and/or other films/layers thereof.

3D-forming via e.g. a thermoforming process such as vacuum or pressure forming, may have been applied to introduce a substantially three-dimensional shape, e.g. a number of recesses 116, to a target element of the multilayer structure, with particular reference to the substrate film layer 102. Few practical examples for the lower limit of usually suitable thermoforming temperatures (degrees Celsius) include: PC 150, PET 70, and ABS 88-120. The pressure applied on a target film obtained either by pressing mechanically air into the mold or by sucking a vacuum into the mold could be roughly over some 100 psi for a single layer film construction whereas it could be roughly over some 200 psi for laminated structures. The used film and the process parameters shall be preferably selected such that said film does not melt unless so desired.

In terms of molding parameters, few further merely exemplary guidelines could be given. When the target film such as substrate film 102 is e.g. PET and the plastics to be, for example, injection molded thereon is PC, the temperature of the melted PC may in common cases be about 280 to 320 degrees Celsius and the mold temperature about 20 to 95 degrees Celsius, e.g. about 80 degrees Celsius. The used film and the process parameters shall be preferably selected such that said film does not melt and remains substantially solid during the process unless otherwise desired. The film shall be positioned in the mold such that it remains properly fixed. A person skilled in the art will appreciate the fact that best forming and molding parameters depend e.g. on the used materials and target characteristics of the structure to be established, whereupon they should be, in optimum case, selected case-specifically by relying on the known properties and behavior of the materials when subjected to thermal stress and physical stress such as stretching caused by e.g. pressure/vacuum. Yet, special care shall be taken to preserve the electronics and possible other elements already provided on the substrate film layer 102 prior to molding, by the proper selection of the molding, as well as forming, parameters.

In various embodiments, the multilayer structure may have been arranged with preferably integral, e.g. molded, features, such as optionally hole/insert-provided bosses (for e.g. rivets or screws) and associated bases, for attaching, spacing and/or positioning the structure relative to external surfaces and e.g. host devices. Yet, a number of integral, preferably molded, features such as ribs may have been incorporated to reinforce the structure.

Figure 3A:
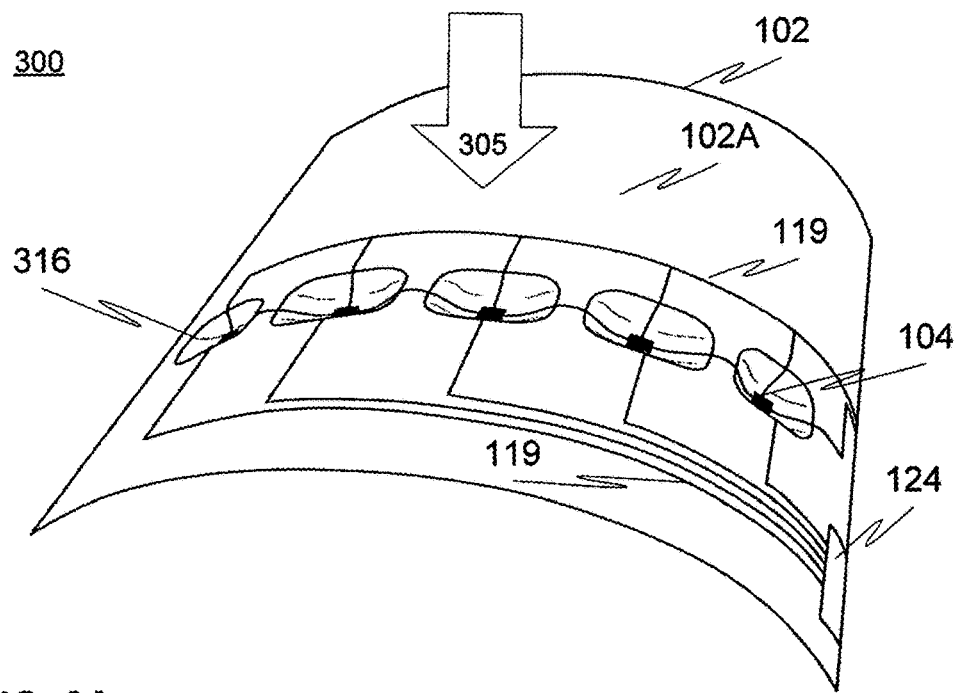
FIGS. 3A and 3B depict one other embodiment, or more specifically still essentially a workpiece, of a multilayer structure in accordance with the present invention after provision of electronics and forming, but prior to molding.
Figure 3B:
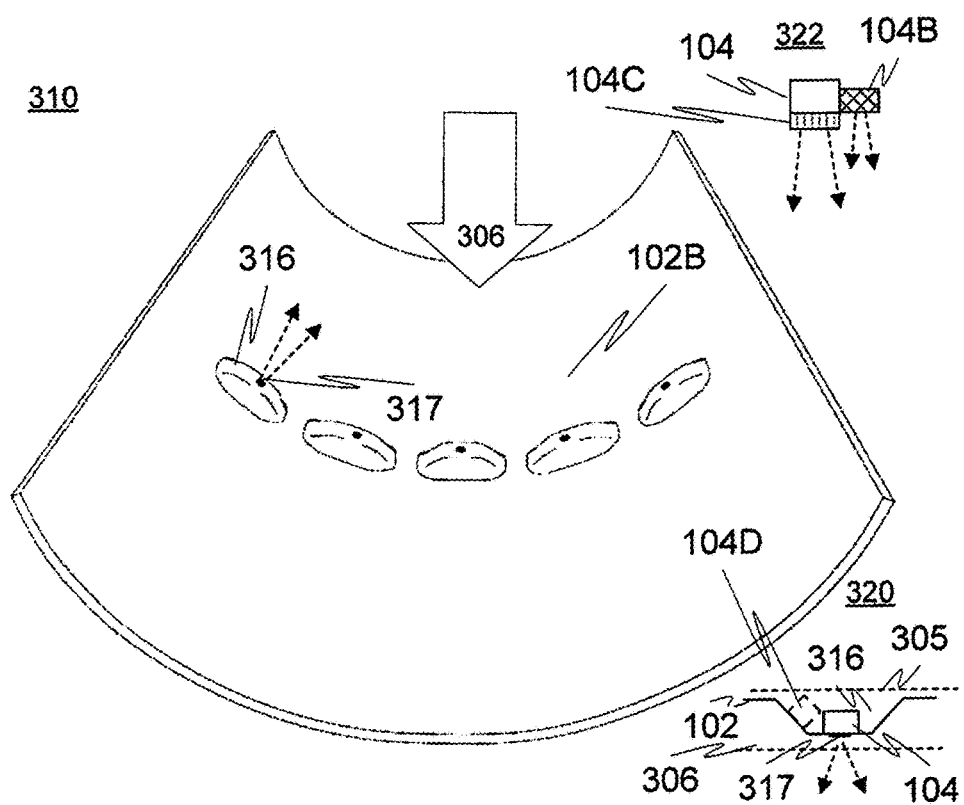

FIGS. 3A and 3B depict one other embodiment, or more specifically still a workpiece, of a multilayer structure in accordance with the present invention after provision of electronics and 3D-forming but prior to molding.

Generally, the previous considerations provided herein regarding the embodiment of FIGS. 1 and 2 in terms of e.g. utilized manufacturing and processing technologies, included elements/components, used materials, constituting layers, etc. are fully applicable also in connection with the embodiment of FIGS. 3A and 3B. Therefore, the above considerations are not unnecessarily repeated here in favor of readability and intelligibility, as being appreciated by a person skilled in the art. Instead, the features rendering the embodiment of FIGS. 3A and 3B different from the previous one are mainly contemplated below.

As one may recall, in the embodiment of FIGS. 1 and 2 the transmissive layer 106 was molded on the first, recesses-defining, side 102A of the film 102 so that e.g. the light sources 104 were also preferably embedded in the molded material. In contrast, in the embodiment of FIGS. 3A and 3B, similar or different transmissive material 306 may be optionally molded on the back, opposite side (protrusions-defining side) 102B of the substrate film layer 102 so that it at least partially covers the opposing protrusion sides of the forms 316 established by 3D-forming of the substrate film 102. Yet, the first side 102A of the layer 102 and elements thereon, such as light sources 104, conductor traces 119 and/or potential further electronics 124, may be overmolded with optically e.g. substantially opaque, optionally reflective, material 305 if desired.

At 300, the first side 102A of the substrate film layer 102 is shown with evident recess forms 316 therein, while at 310 the opposite, second side of the same film 102 is shown with corresponding protrusion shapes.

Still in the shown example, the recesses 316 have been substantially aligned in row formation. Each recess 316 accommodates a light source 104 at the bottom thereof. In different variants of the solution, there may be e.g. several, optionally parallel, rows of light sources produced upon the substrate film 102 with related recesses 316 in contrast to the shown, merely exemplary, case with a single row only. The illustrated recesses 316 exhibit a substantially rectangular periphery but also other shapes are possible. Each recess 316 has been allocated a dedicated, single light source 104 (or conceptually vice versa, when inspecting the construction from the standpoint of a manufacturing process where the light sources 104 may be provided to the layer 102 prior to forming), but in some other embodiments at least one recess 316 could contain multiple light sources 104 with mutually similar or different characteristics in terms of e.g. emitted light (e.g. wavelength/color).

The merely exemplary cross-sectional sketch at 320 depicts how a light source 104 positioned in a recess 316 is aligned so that the light emitted enters, via an optically transmissive (translucent or transparent) element or portion 317 of the film layer 102, to the second side 102B of the layer 102 and propagates within the material 306 optionally molded thereon to eventually exit the shown structure or enter a further layer of material at the location of the dashed line. By the recess 316, the distance of the light source 104 and target material, surface or interface as represented by the dashed line below may be minimized and the light source 104 be brought closer to the target, for example, to reduce e.g. leakage and losses along the related optical path. The portion 317 may have e.g. round or angular, such as rectangular, periphery that extends through the film 102 and thus defines a translucent or transparent window therein for the light emitted by the source 104. The window may contain preferred translucent/transparent, typically solid, material or essentially define a through-hole in the layer 102. The remaining portions of the film layer 102 may be either optically transmissive (transparent/translucent) or opaque.

In some embodiments, the material 305 molded or otherwise provided upon the first side 102A of the film layer 102, preferably thus filling up at least portion of the recess 316 and embedding the light source 104, may be optionally optically transmissive (transparent or translucent) and configured to implement, together with a further material layer thereon, optical reflector (material interface) having regard to the light emitted by the light source 104 to re-direct the incident light back towards the bottom of the recess 316 and e.g. portion 317.

In some embodiments, a substantially opaque layer, preferably a film, ink, tape, other pigmented material or a molded layer, may be provided on or within the second side 102B of the substrate film layer 102, the opaque layer still comprising translucent or transparent portions, such as holes or windows covered in translucent/transparent material, aligned with the translucent or transparent portions of the film to enable the light emitted by the light sources 104 to pass through.

In some related embodiments, the substrate film layer 102 may itself be substantially opaque, optionally highly absorptive to light incident thereon from the second side 102B, further optionally imparting black color to such light, and/or highly reflective to light incident thereon from the first side 102A, optionally thus imparting white color to such light.

At 322, it is roughly presented how an embodiment of a light source 104 may contain optics on the side 104B, with reference to e.g. a side shooting LED (side meaning in this context the direction and plane substantially perpendicular to the contact surface of the hosting film layer 102), and/or on the bottom/top (flipped) surface 104C thereof. Accordingly, the optics may be positioned so as to convey the light emitted by the source 104 to the element 317 for passing through the film layer 102. The optics 104B, 104C, which may refer to integral (e.g. lens) and/or separate or so-called secondary optics from the standpoint of the light source such as LED, may be positioned so as to contact the portion 317 to enable effective optical coupling between them. The optics 104B, 104C and optionally the rest of the light source 104 may thus be superimposed with the portion 317.

Similar considerations as to the general structure of the light source 104 and related integral and/or separate optics apply to embodiment of FIGS. 1 and 2 as well, wherein e.g. a top emitting LED may be attached from the opposing, bottom side to the substrate film 102 so that the light is incoupled effectively to the overmolded layer 106. Also e.g. a side emitting light source such as a LED could be applied with necessary optics guiding the emitted light into the molded layer 106.

Figure 4:
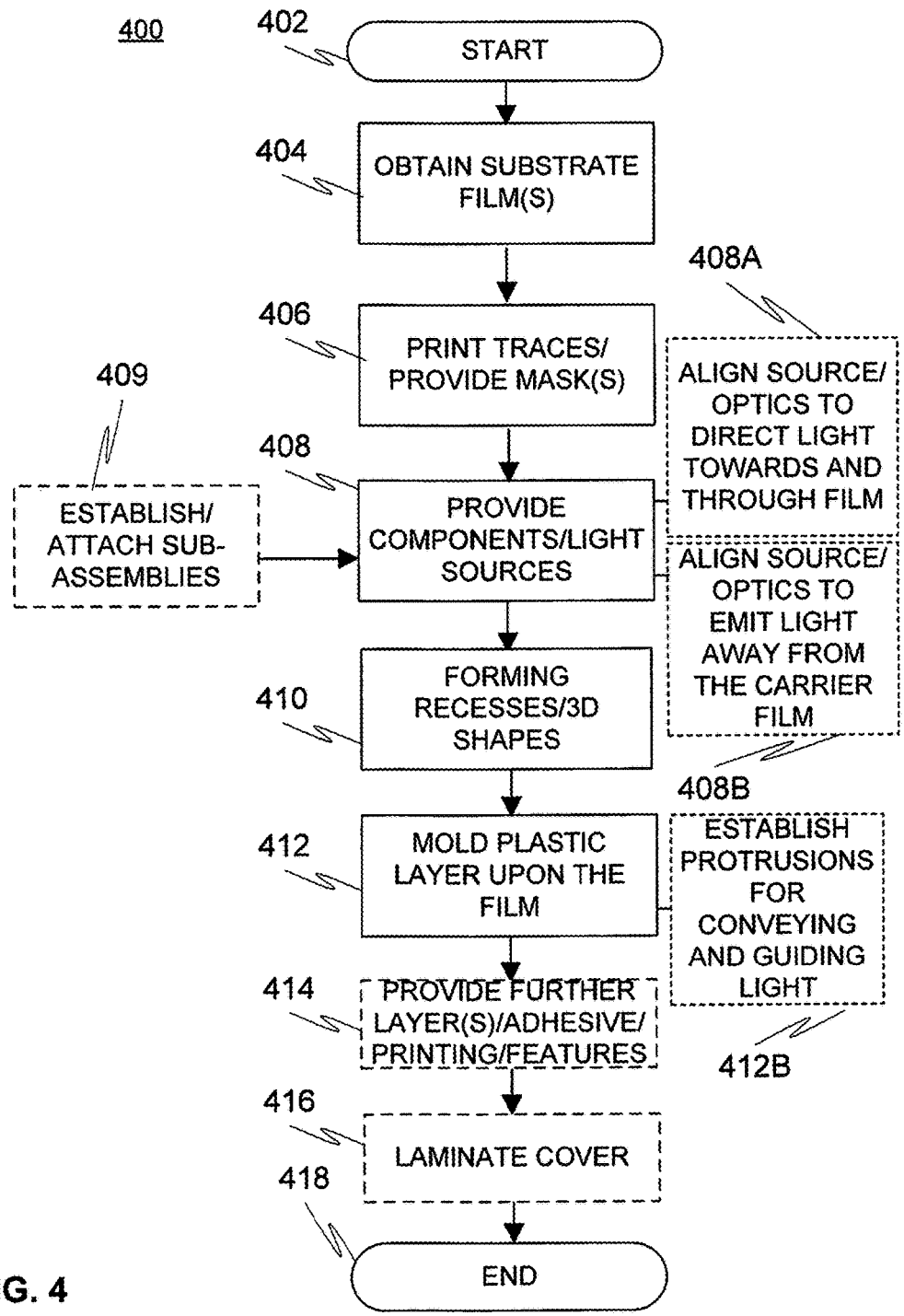
FIG. 4 is a flow diagram disclosing different features of few applicable embodiments of a method of manufacture in accordance with the present invention.

FIG. 4 is a flow diagram disclosing different features of few applicable embodiments of a method of manufacture in accordance with the present invention. By selective adoption of shown method items e.g. the embodiments of FIGS. 1-2 and 3A-3B could be produced.

At the beginning of the method for manufacturing the multilayer structure, a start-up phase 402 may be executed. During start-up 402, the necessary tasks such as material, component and tools selection, acquisition, calibration and other configuration may take place. Specific care must be taken that the individual elements and material selections work together and survive the selected manufacturing and installation process, which is naturally preferably checked up-front on the basis of process specifications and component data sheets, or by investigating and testing the produced prototypes, for example. The used equipment such as molding/IMD (in-mold decoration), lamination, bonding, (thermos)forming, cutting, drilling and/or printing equipment, among others, may be thus ramped up to operational status at this stage.

At 404, at least one, preferably flexible, substrate film or other typically planar substrate for accommodating electronics is obtained to establish a substrate film layer. A plurality of films and optionally further features as discussed above may be here converted into the film layer with reference to e.g. different coatings. A ready-made element of substrate material, e.g. roll of plastic film, may be acquired, for instance. In some embodiments the substrate film itself may be first produced in-house by molding or other methods from the desired starting material(s). Optionally, the substrate film is processed. It may be, for example, provided with openings, notches, recesses, cuts, etc. as contemplated hereinbefore.

At 406, a number of conductive traces defining e.g. conductor lines, contact pads (or other contact areas), etc. for electrically coupling electronic components, are provided on the film, preferably by one or more techniques of printed electronics. For example, screen, inkjet, flexographic, gravure, tampo or offset lithographic printing may be utilized. Also further actions cultivating the film(s) involving e.g. printing of graphics, visual indicators, etc. on the film(s) may take place here. At this stage, the substrate film layer and optionally electrical conductors provided thereon may be further e.g. partially covered by a number of elements such as (printed) coatings, tapes and/or films for masking purposes, for instance.

At 408, electronics such as a number of light sources may be arranged on the substrate film, optionally by printing. Ready-made components such as various SMDs (light sources such as LEDs and/or other features such as various integrated circuits contemplated hereinbefore) may be attached to the contact areas by solder and/or adhesives. Electrical connection between the electronics and the conductors provided at 406 may be provided by the solder and/or conductive adhesive, or the contact portions such as pins of the electronics may be pressed into still wet conductor traces of the substrate, for instance. Alternatively or additionally, printed electronics technology may be applied to actually manufacture at least part of the components, such as OLEDs, directly onto the film(s). Item 409 refers to provision of pre-prepared sub-assemblies upon the substrate film.

To produce the embodiments of FIGS. 1-2 and 5-6, item 408B may be executed, which refers to positioning light sources and/or potential related additional optics upon the substrate film so that the light emission direction is away from the substrate (e.g. essentially to the opposite direction using e.g. top emitting LED or other applicable light source).

To produce the embodiment of FIGS. 3A-3B, item 408A may be executed where the positioning of the light sources and related integral and/or additional optics enables conveying the light emitted through the substrate film via a portion that is at least translucent or transparent to the light. As discussed hereinbefore, the portion may be established by a window of translucent/transparent material in the substrate film layer, for example.

In case e.g. reflow soldering is utilized to install electronics, the substrate film layer may be conveyed through reflow oven.

Also at this stage, the substrate film layer and optionally electrical conductors and electronics provided thereon may be further e.g. partially covered by a number of (masking) elements such as coatings, tapes and/or films.

At 410, the substrate film layer is 3D-formed using thermoforming such as pressure or suction forming, for example. Preferably at least the required recesses are formed for the light sources. The substrate film layer containing thermoformable material may further be generally shaped to better fit the target environment or host surface/device and related shapes. After forming, the substrate film layer may generally exhibit e.g. a curved shape. Additionally or alternatively, forming could take place after molding in case the multilayer stack is designed to survive such processing. At least some forming could also take place prior to the provision of light sources and potential other electronics on the substrate film layer, which however leads to subsequent 3D assembly of electronics. Accordingly, in many embodiments provision of light sources and possible further electronics prior to forming is preferred.

To prevent introducing damage to the light sources and/or other electronics during forming the primary objectives of which may be optical and in facilitating the final positioning of the structure to a host surface as discussed hereinbefore, e.g. computer-aided modeling (CAD) or model building and related three-dimensional surface strain measurements may be carried out, for example, having regard to the substrate. Modeling may incorporate parameters having regard to strains, forces, dimensions, thermal and/or stress analyses as well as possible failures, such as fractures of the film caused by the forming of a substantially flat substrate film layer into a substantially three-dimensional counterpart. Modeling may comprise stress analysis of the structure.

Preferably, the light sources and/or other electronics can be then positioned to locations that are free from excessive stress during or subsequent to forming to prevent related breakage of the sources/electronics. In general this may include placing an element according to the shape of the surface, on which it is to be attached on, so that the deformation of the flat surface area of the film relative to the surface area of the element against the said surface area of the film is sufficiently minor. More specifically, the magnitude of the curvature of the film surface, said curvature caused by the three-dimensional forming of the film, relative to the facing element surface projection could be minimized, for example. With reference to forming of recesses that are configured to accommodate the light sources, e.g. the bottom of each recess that contacts the associated light source(s) could be maintained relatively planar to avoid causing stress to attached light source having a planar contact surface, for example. Generally, the shapes such as curvature of the contacting surfaces of both the substrate film layer and the light source could thus be kept about the same to avoid additional stress subjected to the source.

At 412, at least one thermoplastic layer is molded upon the substrate film layer. Depending on the embodiment as contemplated hereinearlier, the first side and associated surface of the substrate film (side of the light sources) may be overmolded. Additionally or alternatively, the opposing, second side and associated surface may be overmolded with suitable material as well. In practice, the substrate film layer provided with the light sources and optional other electronics may be used as an insert in an injection molding process. Optionally, in some embodiments a further film or generally element may be provided as another, opposing insert in the mold with reference to the embodiment of FIGS. 5 and 6, for example. The further film may have been provided with mounted and/or printed elements, such as conductors, electrodes and/or components. Potentially applicable molding parameters have been already discussed hereinbefore.

At 414, a number of further layers (e.g. adhesive layer, optical/diffuser film, etc.) may be provided to the obtained structure, optionally through lamination and/or molding, depending on the embodiment. These layers may additionally or alternatively be provided subsequent to item 416 as well.

At 416, a cover member may be provided with particular reference to the embodiments of FIGS. 1-2 and 5-6, where a cover member comprising preferably elongated indicator elements is utilized (FIGS. 1-2). Suitable lamination technique relying on heat, adhesive and/or pressure may be applied, for instance.

Regarding the resulting overall thickness of the obtained stacked structure, it heavily depends on the used materials and related minimum material thicknesses providing the necessary strength in view of manufacturing and subsequent use. These aspects have to be considered on case-by-case basis. For example, the overall thickness of the structure could be about 1 or few millimeters, but considerably thicker or thinner embodiments are also feasible.

Yet, a number of post-processing tasks may be executed. Shaping/cutting may take place. Further elements and/or layers may be provided to the obtained multilayer structure. The structure may be attached to or included in an external host surface or device, for instance.

At 418, method execution is ended.

Figure 5:
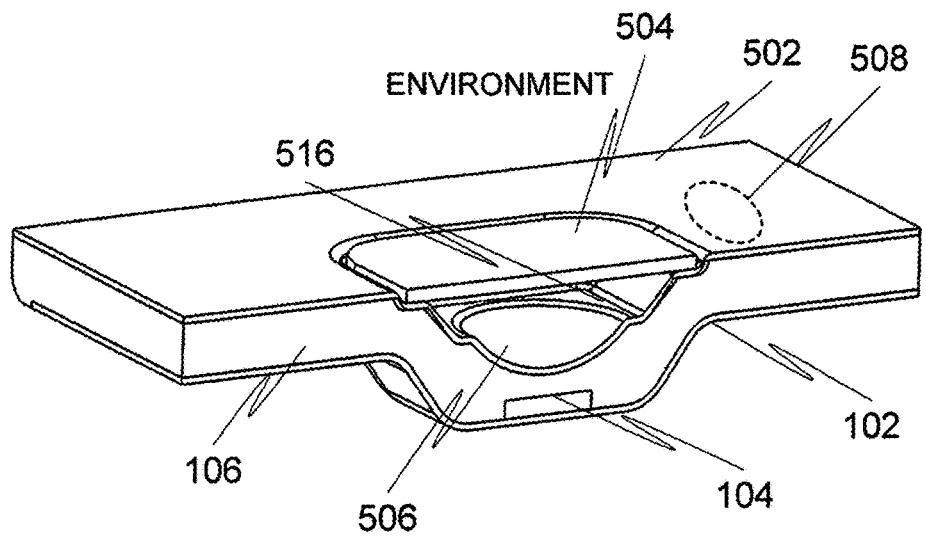
FIGS. 5 and 6 depict further embodiments of a multilayer structure in accordance with the present invention.
Figure 6:
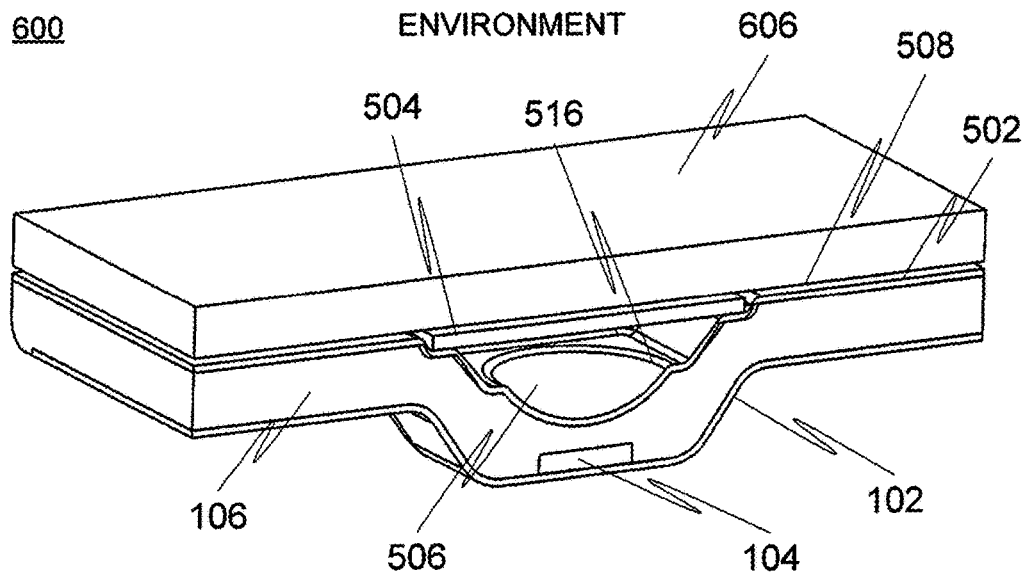

FIGS. 5-6 depict further embodiments 500, 600 of a multilayer structure in accordance with the present invention.

The various considerations regarding e.g. material selections, included elements, processing and manufacturing methods, as well as optical properties regarding the structures already presented hereinbefore in the previous embodiments are generally applicable also here.

Once again, the substrate film 102 provided with electronics including a number of light sources 104 and e.g. printed conductors, is 3D-formed optionally more generally and at least so as to establish a number of recesses 516 for accommodating the light sources 104 (e.g. one or multiple sources 104 such as LEDs per recess 516). Then the film 102 is overmolded with material 106 filling the space between the first 102 and optional second 502 film, and supplemented with one or more top (cover) elements 504, 606 facing the environment and e.g. a user residing therein.

Between the molded material 106 or second film 502 and an upper element 504, 606, a gaseous volume such as an air gap may remain.

The feature 504 refers to an optical element such as diffusive element, which may originally be a separate diffusor/element, e.g. a piece of film, that is then installed in the multilayer structure 500, 600, or it may be established from a portion of larger element 606 described hereinlater, by diffusive printing and/or surface relief forms, for example.

The molded material 106 and the optional second film 502 may have been configured, through e.g. molding and forming, respectively, so as to establish an optical element 506, such as a lens, for converging, diverging (spreading) or otherwise optimizing the distribution of transmitted light. For example, uniformity of light incident on the element 504 may be thus increased.

In some embodiments, a gaseous volume such as air gap may remain in the recess 516 between the molded material 106/second film 502 and above element 504, 606 as shown in the figure.

By the integration of the optical element 506, the thickness of the recessed portion of the film 102, and thus the material thickness of the overall multilayer assembly shown, may be kept reasonable, for instance, as the element 506 may already effectively reduce e.g. undesired light leakage to adjacent structures, which would have been otherwise implemented through increasing the depth of the recess 516, thus also adding to the overall material thickness at least locally.

The top element 606 may refer to a laminated visual front part, such as a sheet, which is preferably at least translucent, at least in places, to enable the light emitted by the light source 104 to pass through to the environment. The element 606 may include e.g. a number of preferably additively printed decorations, graphics, icons, or other translucent or transparent optical features to be illuminated by the light source(s) 104 below to produce a related lighting effect.

Item 508 refers to at least one electrode e.g. for sensing, preferably touch sensing, or 'touch detection', purposes optionally formed from additively printed conductive material such as conductive ink. The electrode 508 may be thus utilized for capacitive sensing, for example. The electrode 508 may be provided in the second film 502, e.g. on either surface (exterior, interior) thereof, or as embedded therein. Alternatively, the electrode 508 could be provided on the (top) face of the molded layer 106, or at element 606. Accordingly, the electrode(s) 508 may be advantageously located close to a predefined touch area (touch surface) on the outer surface of the film 502 or element 606 to increase detection sensitivity and thus also detection range.

In preferred embodiments, the location of the electrode 508 may be selected so that there is no air gap or generally gas volume (such as the one potentially established at the location of the recess 516 above the molded material 106 and possible second film 502) between it 508 and the touch surface to reduce associated performance problems. Accordingly, the electrode 508 may be more preferably located adjacent to or farther away from such air gap, as shown in the figure. In some embodiments, at least one electrode could be additionally or alternatively arranged to the first film 102. The electrode 508 may be electrically or electro-magnetically coupled to control electronics that are included in the structure 500, 600 or external thereto.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

In some embodiments of the present invention with reference to e.g. aforedescribed embodiments of FIGS. 1-2, 3A-3B, and 5-6, instead of a single light source, a plurality of light sources 104 such as LEDs may be positioned within a recess 116, 316, 516 which may facilitate, for example, producing and outcoupling a desired light pattern therefrom.

In some embodiments, in addition to one or more elongated recesses 116, also at least one recess 316, 506 which may be more localized or e.g. round/dome-like in general shape in contrast to more groove-like elongated recess 116, may be provided and configured with one or more light sources 104 such as LEDs therein.

In some embodiments, one or more light sources 104 such as LEDs may be configured, such as positioned, mounted or manufactured (e.g. printed by means of printed electronics technology), within a recess 316, 516 of substrate 102 so as to remain slanted/tilted/inclined and/or otherwise specially aligned (e.g. rotated) relative to a reference such as (a plane defined by) the recess bottom, or specifically e.g. window-defining portion 317, and/or element upon the recess 316, 516 such as the surface of material layer 305, substrate 102 (surface level), film 502, other top or upper element 504, 606, or e.g. optical element 506. Notwithstanding tilting and/or other special alignment, the light source(s) 104 may thus still stand on the substrate 102 and be located at the recess bottom and/or side walls, for example.

Having regard to any of the above and other embodiments, said one or more light sources 104 such as LEDs may be configured, through positioning or directly manufacturing, for instance, so as to off-center or off-position from e.g. the center of the recess bottom and/or the location corresponding to a selected feature such as portion 317. In some embodiments, such off-positioning or off-centering may enable or add to achieving the slanted/tilted alignment of the light sources 104 relative to the reference and/or e.g. desired lighting pattern.

For example, with reference to sketch 320, the light source 104 is shown configured substantially at recess 316 bottom, substantially centered and corresponding to the location of portion 317. Instead, one or more light sources 104D could have been alternatively off-positioned, e.g. to or at least towards the sides of the recess 316, to off-center, and/or tilt them (if ending up at least partially standing on the recess walls as shown, for example) relative to a reference such as portion 317 (and/or center of the recess bottom) in favour of e.g. desired lighting effect potentially therethrough/therethrough.

The aforementioned configurations may be generally utilized to adjust, such as lengthen or otherwise tune, e.g. associated lighting and/or spatial properties such as the distance between the light source 104, or particularly e.g. light-emitting portion thereof, and other element, optionally window-defining portion 317. Alternatively or additionally, by such configurations multiple light sources 104, or particularly e.g. light-emitting portions thereof, may be more effectively fit and adjusted to point towards desired direction(s) such as the other element.

The skilled person will readily understand e.g. various possibilities for selectively combining the afore-explained embodiments. For instance, the principle of providing a dedicated recess for each single light source could be adopted from the embodiments of FIGS. 3A-3B or 5-6 in the embodiment of FIGS. 1-2 having regard to at least some of the light source(s). Accordingly, the shapes and dimensions of further related elements such as protrusions, cover members and indicator elements could be adopted respectively between the embodiments. Correspondingly, the elongated recesses each accommodating several light sources, as currently provided in the embodiment of FIGS. 1-2, could be utilized in connection with the embodiments of FIGS. 3A-3B or 5-6 either solely or together with single light source—accommodating recesses.

Still with reference to the embodiment of FIGS. 5-6, wherein an electrically conductive area for touch sensing purposes was provided, similar touch-sensitive area(s) may be flexibly incorporated into other embodiments as well, such as the ones of FIG. 1-2 or 3-4 described hereinbefore, by a person skilled in the art.

The invention claimed is:

1. A stacked light-emitting multilayer structure, comprising:
    a substantially opaque cover member with a number of elongated indicator elements extending through the cover member, the cover member having an outer face towards the environment and a substantially opposite inner face towards the internals of the structure, each elongated indicator element having a periphery that defines a corresponding indicator shape in the cover member, each indicator element comprising an at least optically translucent material to transmit light incident thereon and enable backlight arriving at the inner face to exit via the outer face;
    a flexible substrate film layer of at least one film, 3D-shaped to define a number of elongated recesses, each elongated recess substantially aligned with a respective one of the number of indicator elements of the cover member, the film layer hosting, in each of the formed recesses, a plurality of substantially aligned light sources disposed thereon spread along the length of the recess and configured to emit light substantially towards the cover member; and
    a thermoplastic optically transmissive light-guiding material layer molded onto the film layer between the film layer and the cover layer so as to embed said plurality of light sources while defining a plurality of elongated protrusions aligned with the recesses and the indicator elements, each of said protrusions being configured to convey the light emitted by the underlying light sources of the corresponding recess of film layer towards the cover member, supporting substantially total internal reflection based propagation of light therewithin enabled by an interface between the side walls of the protrusions and neighbouring material.

2. The structure of claim 1, wherein said film layer comprises a number of electrically conductive traces connecting said plurality of light sources.

3. The structure of claim 2, wherein the film layer comprises a masking layer on a base layer accommodating the traces.

4. The structure of claim 1, wherein the molded light-guiding layer defines a substantially w-shaped cross-section taken in the transverse direction relative to at least one recess, aligned light sources, or elongated protrusion, said protrusion defining the middle ridge of the cross-section.

5. The structure of claim 1, wherein at least one elongated recess of the 3D-shaped film layer defines a substantially trapezoidal cross-sectional shape with a shorter base accommodating the light sources and a longer base missing.

6. The structure of claim 5, wherein the sides of the trapezoidal shapes defining the legs thereof establish about 45 degree, angle relative to the surface normal of the film layer at the bottom of the recess.

7. The structure of claim 1, wherein at least one elongated protrusion and two side walls established by the molded layer upon a recess of the film layer define preferably mutually symmetric valleys containing said neighbouring material between each of said side walls and the elongated protrusion residing in between.

8. The structure of claim 1, further comprising adhesive layer between the molded light-guiding layer and the cover member.

9. The structure of claim 1, further comprising one or more optically functional films or other layers between the molded light-guiding layer and the cover member.

10. The structure of claim 1, further comprising a gap of air or other gaseous material in between at least one of said protrusions and the cover member.

11. The structure of claim 1, wherein at least a recess-defining portion of the substrate film layer is highly reflective.

12. The structure of claim 1, wherein at least a portion of the substrate film layer external to the recesses is substantially opaque.

13. The structure of claim 1, wherein the flexible substrate film layer defines at least one substantially non-elongated recess hosting a number of light sources therein.

14. A method for manufacturing a light-emitting multilayer structure, comprising:
    obtaining a flexible substrate film layer of at least one film;
    providing a number of electrically conductive traces to the substrate layer to establish a predetermined circuit design;
    configuring a plurality of light sources on the substrate layer substantially aligned in a number of rows, connected to the circuit design established by the traces;
    3D-shaping the substrate layer so as to define, for each said row of light sources, an elongated recess at the bottom of which the corresponding row is located;
    molding a thermoplastic optically transmissive light-guiding material layer onto the film layer to embed said plurality of light sources in said number of rows located in the elongated recesses, wherein said light-guiding layer further defines upon each recess and related row of light sources in the recess, a light-guiding, optically transmissive protrusion extending away from the substrate layer and said related row of light sources; and
    providing a substantially opaque cover member with a number of elongated indicator elements extending through the cover member upon the molded light-guiding layer, the cover member having an outer face towards the environment and substantially opposite inner face towards the internals of the structure including the molded light-guiding layer with the protrusions and underlying film layer with said plurality of light sources, wherein said number of indicator elements, rows of light sources and protrusions are mutually aligned so as to enable light propagation from each light source, via the overlapping light-guiding layer and a protrusion thereof, into a still overlapping indicator element of said number, and the environment therethrough.

15. The method of claim 14, further comprising at least one process element selected from the group consisting of: provision of a diffuse layer, provision of adhesive layer between the cover member and the light-guiding layer, establishing an optically functional surface relief structure on the light-guiding layer, inner face of the cover member and/or on an additional film between the two, printing graphics and/or color on the substrate layer, cover member, light-guiding layer and/or an additional film included in the structure, and provision of decorated film through in-mold decoration in the structure.

16. A stacked light-emitting multilayer structure, comprising:
a flexible substrate film layer of at least one film, 3D-shaped to define a number of recesses on a first side thereof, the film layer hosting, on the first side in each of the formed recesses, at least one light source disposed thereon configured to emit light through the film layer to a second, opposite side thereof, wherein the film layer contains, in each said recess, at least a portion in contact with the light transmissive optics of the light source and extending through the film layer, said at least portion being optically at least translucent; and
a thermoplastic layer molded onto the first side of the film layer.

17. The structure of claim 16, further comprising a substantially opaque layer on or within the second side of the film layer, said opaque layer comprising translucent or transparent portions aligned with the translucent or transparent portions of the film to enable the light emitted by the light sources to pass through.

18. The structure of claim 16, wherein the film layer is substantially opaque.

19. The structure of claim 16, wherein at least one of the recesses contains a plurality of light sources.

20. The structure of claim 16, wherein at least one of the recesses contains at least one tilted light source.

21. A method for manufacturing a light-emitting multilayer structure comprising:
obtaining a flexible substrate film layer of at least one film, wherein the film layer is at least in places optically translucent or substantially transparent;
configuring a number of light sources on a first side of the substrate layer, wherein an optics of each light source is further aligned so as to contact the film layer at a position where the film layer is optically at least translucent;
3D-shaping the substrate layer so as to define, for each light source of said number;
molding a thermoplastic material layer onto the first side of the film layer.

22. The method of claim 21, further providing a further material layer on a second, opposite side of the substrate film layer.

23. A stacked light-emitting multilayer structure, comprising:
a flexible first substrate film layer of at least one film, 3D-shaped to define a number of recesses on a first side thereof, said recesses, wherein the film layer is optically opaque or transmissive;
a cover comprising one or more material layers, having an outer face towards the environment and substantially opposite inner face towards the internals of the structure including the number of recesses, said cover comprising at least a portion of optically transmissive material extending through the layer, the film layer hosting, in each of the recesses, at least one light source disposed thereon configured to emit light to propagate within the structure towards the inner face of the cover and therethrough towards the environment; and
an intermediate thermoplastic, optically transmissive layer molded onto the film layer, said molded layer substantially embedding the light sources of the number of recesses.

24. The structure of claim 23, wherein the molded thermoplastic layer defines at least one optical element for controlling the light emitted by a light source positioned in a recess of said number recesses in the optical path between the source and the cover layer.

25. The structure of claim 23, comprising at least one electrode for sensing purposes, said at least one electrode being preferably located at said cover, molded thermoplastic layer or second film layer between the two, said at least one electrode.

26. The structure of claim 23, wherein at least one of the recesses hosts a plurality of light sources.

27. The structure of claim 23, wherein at least one of the recesses contains at least one tilted light source.

28. A method for manufacturing a light-emitting multilayer structure, comprising:
obtaining a flexible substrate film layer of at least one film;
configuring a number of light sources on a first side of the substrate layer;
3D-shaping the substrate layer so as to define, for each light source of said number;
molding a thermoplastic, optically transmissive material layer onto the first side of the film layer; and
laminating a cover comprising one or more material layers upon the molded layer, said cover having an outer face towards the environment and substantially opposite inner face towards the internals of the structure including the recesses, said cover comprising at least a portion of optically transmissive, material extending through the layer and optically coupling the environment to the light sources.

* * * * *